United States Patent [19]

Kawata et al.

[11] Patent Number: 4,864,401
[45] Date of Patent: Sep. 5, 1989

[54] SYNCHRONIZATION SIGNAL GENERATOR WITHOUT OSCILLATOR

[75] Inventors: Kazuhide Kawata; Hiroyuki Suzuki, both of Tokyo, Japan

[73] Assignee: NEC Corporation, Tokyo, Japan

[21] Appl. No.: 167,896

[22] Filed: Mar. 14, 1988

[30] Foreign Application Priority Data

Mar. 13, 1987 [JP] Japan .................. 62-58005

[51] Int. Cl.⁴ .............................. H04N 5/04
[52] U.S. Cl. ........................ 358/148; 358/158
[58] Field of Search ............ 358/148, 158, 17, 19; 307/272.1, 272.2; 328/63

[56] References Cited

U.S. PATENT DOCUMENTS 4,600,895  7/1986  Landman .................. 358/158
4,675,612  6/1987  Adams et al. ............. 328/63
4,705,965  11/1987 Stuyt ...................... 307/272.2

FOREIGN PATENT DOCUMENTS 2122450  1/1984  United Kingdom ......... 358/148

Primary Examiner—James J. Groody
Assistant Examiner—David E. Harvey
Attorney, Agent, or Firm—Foley & Lardner, Schwartz, Jeffery, Schwaab, Mack, Blumenthal & Evans

[57] ABSTRACT

A synchronization signal generator includes a delayed signal generator receiving an original oscillation signal from a ceaselessly operated oscillator to generate a plurality of delayed signals having different delay times from the original oscillation signal, and a trigger signal generator receiving a synchronization signal for generating a trigger signal. There is provided a selector circuit receiving the delayed signals and the trigger signal for selecting, among the delayed signals, only the delayed signal in synchronism with the trigger signal with a substantially constant delay.

8 Claims, 4 Drawing Sheets

SYNCHRONIZATION SIGNAL GENERATOR WITHOUT OSCILLATOR

BACKGROUND OF THE INVENTION

1. Field of the Invention

The present invention relates to a synchronization signal generator, and more specifically to a synchronization signal generator for use in a scan type display device which can project a picture superimposed with another picture.

2. Description of Related Art

Heretofore, some kind of synchronization signal generators have been used in the scan type display device such as television receivers in order to make it possible to display, on the display screen representing a broadcasting picture, an indication of a channel number, sound volume, etc., which are different from the broadcasting picture (which will be called a "different picture" hereinafter). For this purpose, a video signal for the different picture must be superimposed on a video signal for the broadcasting picture, and for such a signal superimpose processing, a so-called "on-screen character generator" (called "character generator" hereinafter), which is formed of a semiconductor integrated circuit device, has been used. It should be here noted that the different picture must be indicated at a predetermined position within the display screen. In other words, the different picture must be a predetermined horizontal position.

For this purpose, the conventional character generator has, as a synchronization signal generator, an oscillator which receives a horizontal synchronization signal and is operated and stopped in synchronism with the horizontal synchronization signal for generating an oscillation output. This oscillation output is supplied as a clock to various portions of a signal processor so that the signal processor can generate a desired signal output.

As will be understood from the above description of the character generator, since the oscillation operation of the oscillator, namely the synchronization signal generator, is started and stopped in synchronism with the horizontal synchronization signal, the oscillator has been required to have a good oscillation start characteristic. In general, an oscillator having a good oscillation start characteristic consumes a large amount of electric current when it is in an oscillation condition, and generates a large amplitude of oscillation signal so that the oscillator will inevitably become a noise source for other circuits. In addition, when the conventional synchronization signal generator and another function circuit having a different oscillator are assembled together on the same semiconductor substrate, two terminals must be used only for the synchronization signal generator. This is not convenient since valuable external terminals for the integrated circuit are consumed.

SUMMARY OF THE INVENTION

Accordingly, it is an object of the present invention to provide a synchronization signal generator which has overcome the above mentioned defect of the conventional one.

Another object of the present invention is to provide a synchronization signal generator which does not need to be started and stopped in synchronism with another synchronization signal.

Still another object of the present invention is to provide a synchronization signal generator which does not need to have an internal oscillator.

A further object of the present invention is to provide a synchronization signal generator which operates at a low power consumption and will not become a noise source for other circuits.

The above and other objects of the present invention are achieved in accordance with the present invention by a synchronization signal generator for use in the scan type display device capable of superimposing a different picture upon a picture indicated on a display screen, comprising a trigger circuit responding to a synchronization signal to generate a trigger signal, a generator circuit responding to an original oscillation signal to generate a plurality of delayed signals having delay times which are different from one another and which are shorter than one period of the original signal, a latch circuit receiving the delayed signals and the trigger signal for latching respective logic levels of the delayed signals when the latch circuit is triggered by the trigger signal, a priority decoder coupled to the latch circuit for detecting, on the basis of the data of the logic levels latched in the latch circuit, a delayed signal outputted from the delayed signal generator at a predetermined place from the moment the latch circuit is triggered by the trigger signal, and a selector circuit receiving the delayed signals and coupled to the decoder for selecting and outputting, among the plurality of delayed signals, the delayed signal detected by the priority decoder.

As seen from the above mentioned arrangement, the original oscillation signal is delayed at various delay times so as to generate a plurality of delayed signals having different delay times from the original oscillation signal. Among the delayed signals there is selected and outputted the delayed signal which is outputted at a predetermined place from the moment the latch circuit is triggered by the trigger signal. Therefore, there is produced the oscillation signal which is delayed from the synchronization signal at a predetermined delay time. On the other hand, it is not necessary to start and stop an oscillator for the synchronization signal generator in synchronism with an external synchronization signal.

In a preferred embodiment, the delayed signal generator includes a plurality of cascade-coupled unitary delay circuits each of which gives a unitary delay time D which is obtained by a period of the original oscillation signal by the number of the unitary delay circuits, and the respective outputs of the unitary delay circuits are respectively outputted through a corresponding number of buffers as the above mentioned delayed signals.

Further, the latch circuit is composed of a plurality of unit circuits each of which includes a buffer receiving the corresponding delayed signal outputted from the delayed signal generator, a writing gate connected at its gate to receive the trigger signal from the trigger signal generator and connected at its one end to an output of the buffer, and a flipflop having an input connected to the other end of the writing gate and write-controlled by the trigger signal from the trigger signal generator. More specifically, the flipflop is composed of an inverter having an input connected to the other end of the writing gate and a tristate inverter connected to the inverter in a reversed relation and having an inverted control input connected to receive the trigger signal from the trigger signal generator. With this arrangement, when the trigger signal is active, the tristate inverter is brought into an inoperable condition, so that the writing gate is opened and the input and output of the inverter are isolated from each other to allow the data inputted through the buffer to be inputted to the inverter and the output of the inverter to vary upon the data inputted through the buffer. When the trigger signal is brought into an inactive condition, the writing gate is closed and the tristate inverter is brought into an operable condition, so that the input and output of the inverter are coupled through the tristate inverter to allow the input and output of the inverter to be locked through the operating tristate inverter.

In addition, the trigger signal generator includes a delay circuit having an input connected to receive the synchronization signal, an inverter having an input connected to an output of the delay circuit, a NAND circuit having a first input connected to directly receive the synchronization signal and a second input connected to an output of the inverter, and a second inverter receiving an output of the NAND circuit so as to output the above mentioned trigger signal.

Furthermore, the selector circuit includes a plurality of buffers respectively receiving the delayed signals, a corresponding number of first NAND circuits arranged in parallel, each having a first input connected to receive an output of the corresponding buffer and a second input connected to receive a corresponding decoded signal from the priority decoder, a first logic circuit array composed of a plurality of second NAND circuits arranged in parallel, each of the second NAND circuits having a pair of inputs connected to receive outputs of a corresponding pair of first NAND circuits, a second logic circuit array composed of a plurality of first NOR circuits arranged in parallel, each of the first NOR circuits having a pair of inputs connected to receive outputs of a corresponding pair of second NAND circuits, a third logic circuit array composed of a plurality of third NAND circuits arranged in parallel, each of the third NAND circuits having a pair of inputs connected to receive outputs of a corresponding pair of first NOR circuits, and a fourth logic circuit array composed of a second NOR circuit having a pair of inputs connected to receive respective outputs of the third NAND circuits.

The above and other objects, features and advantages of the present invention will be apparent from the following description of a preferred embodiment of the invention with reference to the accompanying drawings.

DESCRIPTION OF THE PREFERRED EMBODIMENT

Figure 1:
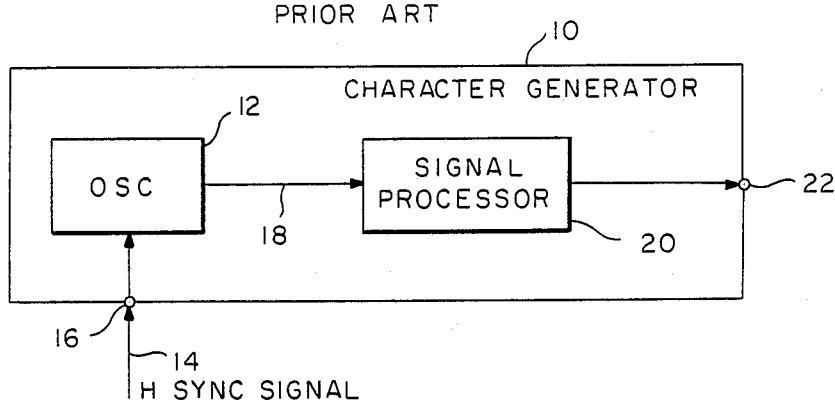
FIG. 1 is a block diagram of a typical conventional character generator.
Figure 2:
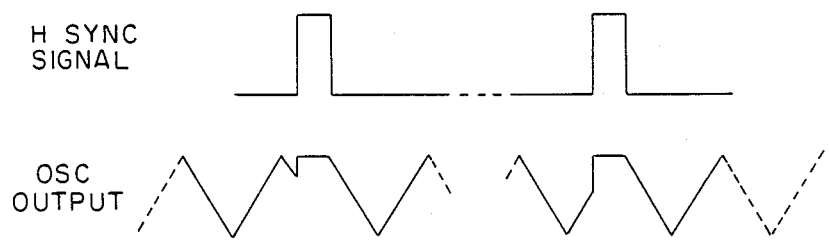
FIG. 2 is a timing chart illustrating the operation of the oscillator used in the character generator shown in FIG. 1.

Referring to FIG. 1, there is shown a typical conventional character generator which is generally indicated by Reference Numeral 10. The shown character generator 10 includes an oscillator 12 receiving a horizontal synchronization signal 14 as shown in FIG. 2 through a horizontal signal input terminal 16. This oscillator 12 is operated and stopped in synchronism with the horizontal synchronization signal 14 for generating an oscillation output 18 as shown in FIG. 2, which is supplied as a clock to various portions of a signal processor 20 so that the signal processor 22 can generate a desired signal output at an output terminal 22.

In the above mentioned character generator, since the oscillator 12 is started and stopped in synchronism with the horizontal synchronization signal 14, the oscillator 12 is required to have a good oscillation start characteristic. For having a good oscillation start characteristic, the oscillator 12 is ordinarily constructed to consume a large amount of electric current when it is in an oscillation condition and to generate a large amplitude of oscillation signal. Such an oscillator will inevitably become a noise source for other circuits. Further, in the case that the shown character generator 10 and another function circuit having a different oscillator are assembled together on the same semiconductor substrate, two terminals must be used only for the character generator. This is not convenient since valuable external terminals for the integrated circuit are consumed.

Figure 3:
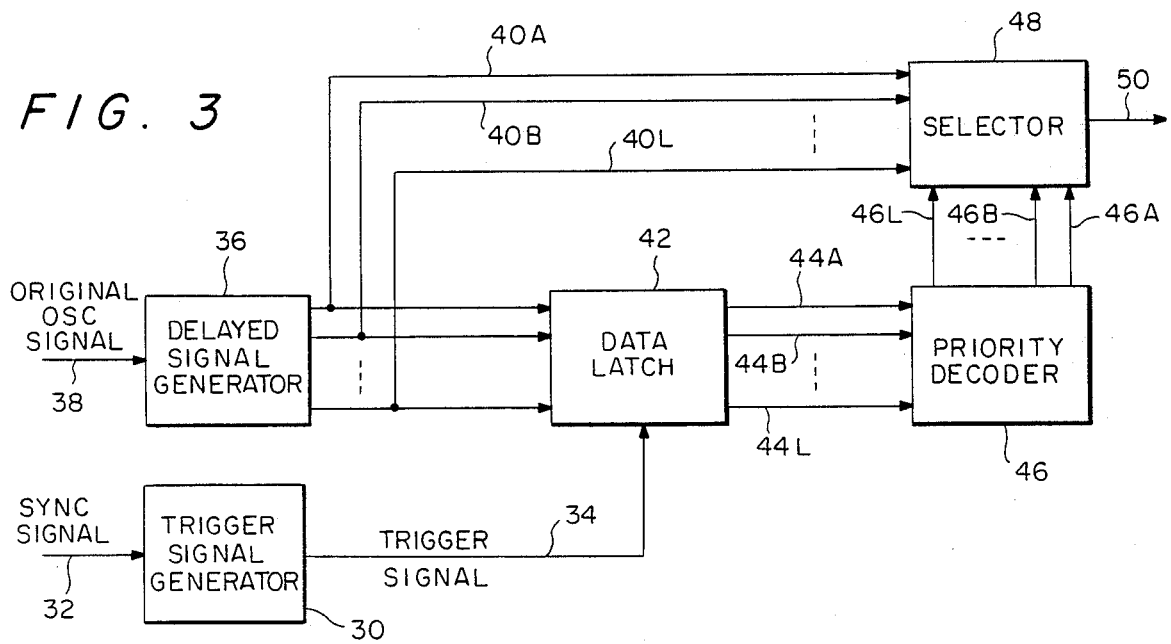
FIG. 3 is a block diagram showing one embodiment of the synchronization signal generator in accordance with the present invention.
Figure 4:
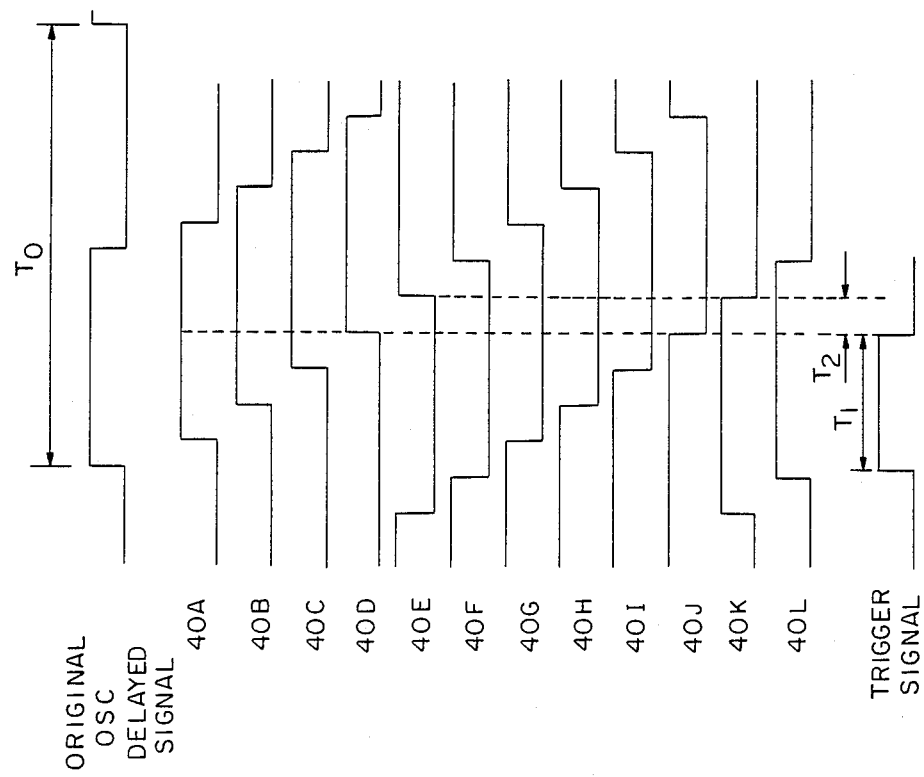
FIG. 4A is a waveform chart illustrating the relation between the original signal, the trigger signal and the delayed signals.
FIG. 4B illustrates the logic levels latched at the timing shown in FIG. 4A.

Turning to FIG. 3, there is shown one embodiment of the synchronization signal generator in accordance with the present invention, which comprises a trigger circuit 30 receiving a synchronization signal 32 from a ceaselessly operated external oscillator (not shown) to generate a trigger signal 34 having a pulse width $T_1$ as shown in FIG. 4A. The synchronization signal generator also includes a delayed signal generator circuit 36 receiving an original oscillation signal having a period of $T_0$ as shown in FIG. 4A to generate twelve delayed signals 40A to 40L which respectively have delay times of N.D (where N is an integer of 1 to 12 and D is a unitary delay time expressed by $D = T_0/12$) and which are different from one another. For example, the delayed signal 40A is delayed by $T_0/12$ from the original oscillation signal and the succeeding delayed signals 40B to 40L have sequentially increased delay times of $2T_0/12$ to $12T_0/12$, respectively.

These delayed signals 40A to 40L are supplied to a data latch circuit 42 which latches respective logic levels of the delayed signals 40A to 40L in response to the trigger signal 34. Thus, the latch circuit 42 supplies twelve logic level signals 44A to 44L, which are fed to a priority decoder 46. This priority decoder 46 is adapted to detect, on the basis of the data of the logic levels 44A to 44L latched in the latch circuit 42, a delayed signal outputted from the delayed signal generator at a predetermined place from the moment the latch circuit is triggered by the trigger signal. On the basis of the result of the detection, the decoder 46 activates one output line of twelve output lines 46A to 46L.

Further, there is provided a selector circuit 48 which receives the delayed signals 40A to 40L and which is controlled by the decoder 46 for selecting and outputting, among the plurality of delayed signals 40A to 40L, the delayed signal detected by the priority decoder 46.

Figure 5:
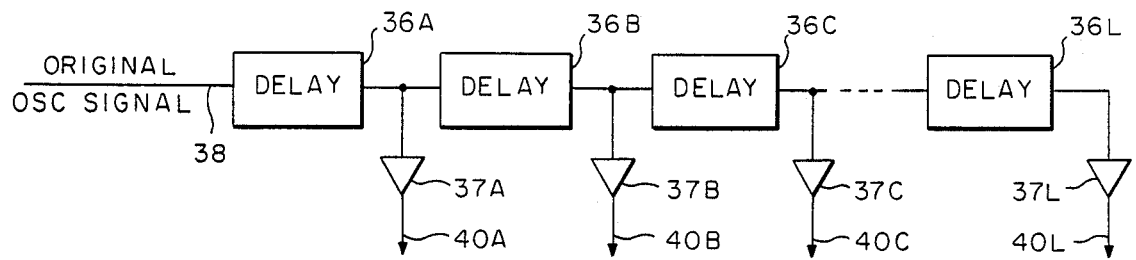
FIG. 5 is a block diagram illustrating one example of the delayed signal generator shown in FIG. 3.

Turning to FIG. 5, there is shown a block diagram illustrating one example of the delayed signal generator 36 shown in FIG. 3. The delayed signal generator 36 includes twelve cascade-coupled unitary delay circuits 36A to 36L each of which gives the unitary delay time D. The respective outputs of the unitary delay circuits 36A to 36L are outputted through buffers 37A to 37L as the delayed signals 40A to 40L.

Figure 6:
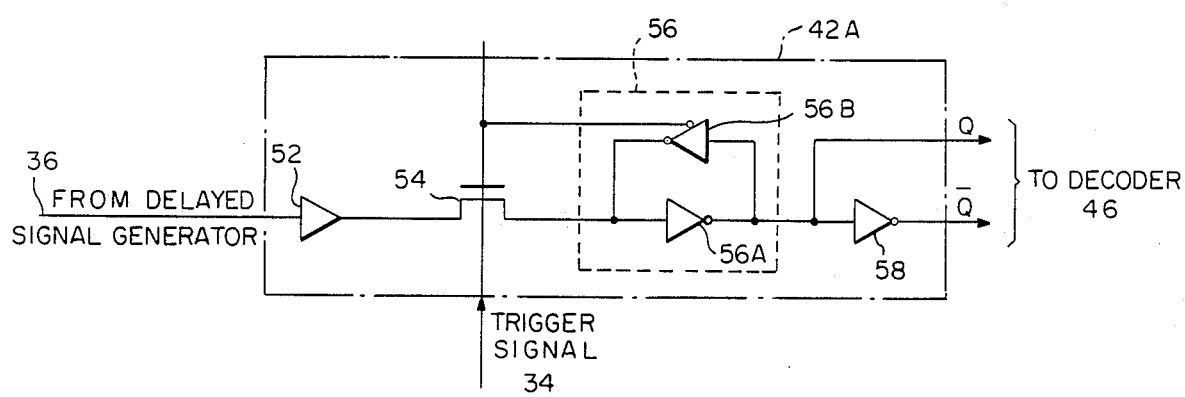
FIG. 6 is a logic circuit diagram illustrating one example of the latch circuit shown in FIG. 3.

Referring to FIG. 6, there is shown a logic circuit diagram illustrating one example of one unit circuit of the latch circuit 42 shown in FIG. 3. In other words, the latch circuit 42 is composed of twelve unit circuits each of which is the same as the circuit shown in FIG. 6. The unit latch circuit 42A shown in FIG. 6 includes a buffer 52 receiving the delayed signal outputted from the delayed signal generator 36 and a writing gate 54 in the form of a transfer gate connected at its gate to receive the trigger signal 34 from the trigger signal generator 30 and connected at its one end to an output of the buffer 52. The other end of the writing gate 54 is connected to a flipflop 56 composed of an inverter 56A having an input connected to the other end of the writing gate 54 and a tristate inverter 56B connected to the inverter 56A in a reversed relation and having an inverted control input connected to receive the trigger signal 34. An output of the flipflop 56 is outputted as a latched Q output directly to the priority decoder 46 and through an inverter 58 as an inverted latched Q output to the priority decoder 46.

Thus, when the trigger signal 34 is active, i.e., at a high logic level, the tristate inverter 56B is brought into an inoperable condition, so that the writing gate 54 is opened and the input and output of the inverter 56A are isolated from each other. Therefore, the data inputted through the buffer 52 is inputted to the inverter 56A and the output of the inverter 56A will vary upon the data inputted through the buffer 52. When the trigger signal 34 is brought into an inactive condition, i.e., at a low logic level, the writing gate 54 is closed and the tristate inverter 56B is brought into an operable condition, so that the input and output of the inverter 56A are coupled through the tristate inverter 56B. Thus, the input and output of the inverter 56A are locked through the operating tristate inverter 56B, and therefore, the data is latched in the flipflop 56. This condition is maintained until the trigger signal 34 is rendered active.

Figure 7:
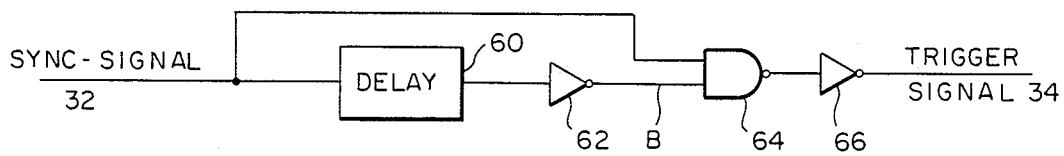
FIG. 7 is a logic circuit diagram illustrating one example of the trigger signal generator shown in FIG. 3.

Turning to FIG. 7, the trigger signal generator 30 shown in FIG. 3 includes a delay circuit 60 having an input connected to receive the synchronization signal 32, an inverter 62 having an input connected to an output of the delay circuit 60 and a NAND circuit having a first input connected to directly receive the synchronization signal 32 and a second input connected to an output of the inverter 62. An output of the NAND circuit 64 is connected to another inverter 66 whose output gives the trigger signal 34.

Figure 8:
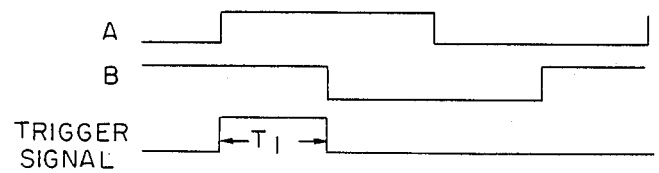
FIG. 8 is a timing chart illustrating the operation of the trigger signal generator shown in FIG. 7.

With this arrangement, assuming that a pulse signal A as shown in FIG. 8 is applied to the delay circuit 60 and the one input of the NAND gate 64, the inverter 62 generates a delayed signal B as shown FIG. 8, and the inverter 66 outputs the trigger signal as shown in FIG. 8. Accordingly, the delay time of the delay circuit 60 determines the pulse width $T_1$ of the trigger signal 34.

Figure 9:
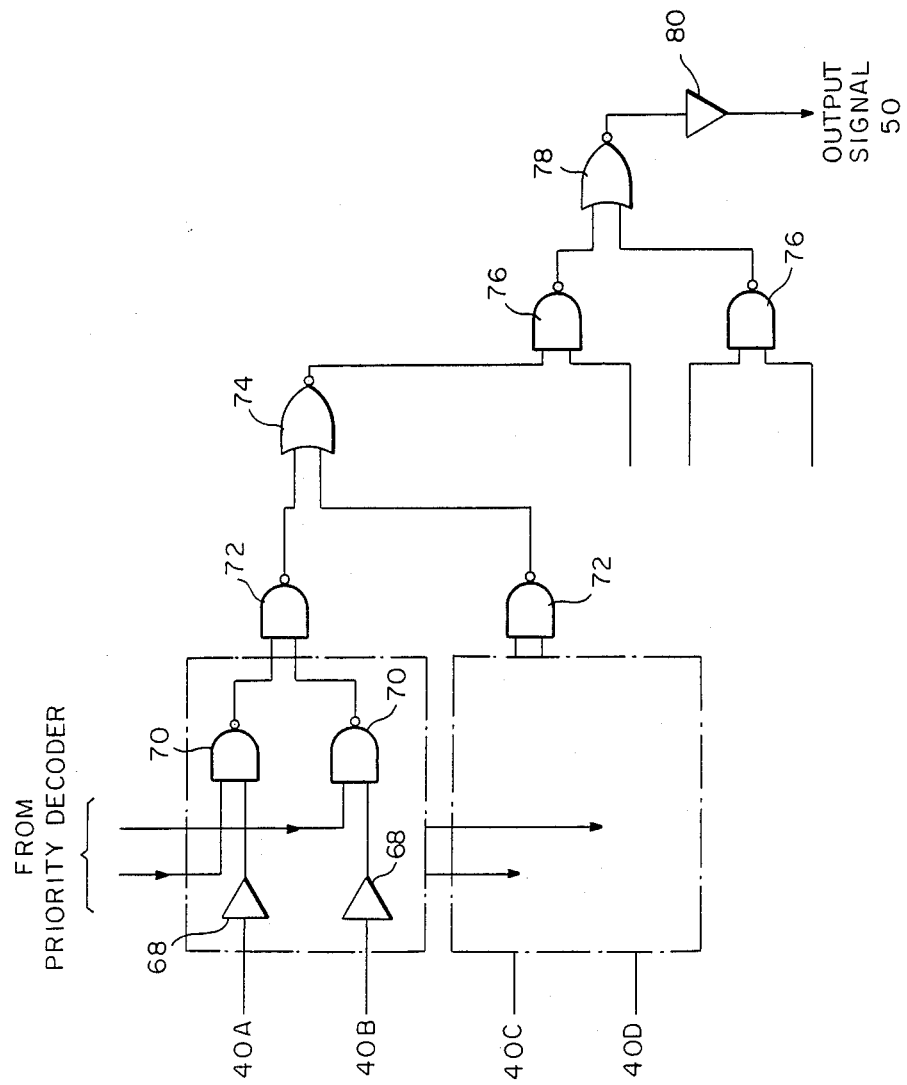
FIG. 9 is a block diagram illustrating one example of the selector circuit shown in FIG. 3.

Referring to FIG. 9, there is shown a block diagram illustrating one example of the selector circuit 48 shown in FIG. 3. The twelve delayed signals 40A to 40L are supplied to twelve buffers 68 (only two buffers are shown), respectively. An output of each buffer is connected to a first input of one associated NAND circuit 70 whose second input is connected to receive a corresponding decoded signal from the priority decoder 46. Outputs of each pair of NAND circuits 70 are coupled to a corresponding NAND circuit 72 of a NAND circuit array. Each pair of NAND circuits 72 are connected at their outputs to a corresponding NOR circuit 74 of a NOR circuit array. Each pair of NOR circuits 74 are connected at their outputs to a corresponding one of two NAND circuits 76. The pair of NAND circuits 76 are connected at their outputs to a NOR circuit 78, which is connected at its output to a buffer 80. This buffer 80 outputs the output signal 50.

With this repeated NAND-NOR arrangement, each time the signal passes through the gate the selection of "one out of two" is carried out, so that the selection of "one out of twelve" can be realized by selecting the stage number of the NAND-NOR arrangement and coupling the logic circuits in an appropriate manner.

The priority decoder 46 can be realized by a conventional ROM decoder, and therefore, a detailed description will be omitted.

Now, operation of the above mentioned synchronization signal generator will be explained with reference to FIGS. 4A and 4B.

Assuming that the original oscillation signal 38 as shown in FIG. 4A is applied to the delayed signal generator 36, the delayed signal generator 36 generates the twelve delayed signals 40A to 40L having different delay times as shown in FIG. 4A. On the other hand, assume that a synchronization signal is supplied to the trigger signal generator 30 and the trigger signal generator 30 generates the trigger signal 32 as shown in FIG. 4A. As seen from the aforementioned description, in response to the falling edge of the trigger signal 32, the data latch circuit 42 latches the respective logic levels of the twelve delayed signals 40A to 40L. In this case, as will be seen in a comparison between the trigger signal and the twelve delayed signals shown in FIG. 4A, the latch circuit 42 latches the logic levels as shown in FIG. 4D, respectively.

The priority decoder 46 searches a latch signal or a logic level "0" fulfilling such a relation that a latch signal corresponding to a delayed signal advanced by one unitary delay time D from the delayed signal corresponding to the latch signal concerned of the logic level "0" has a logic level "1" and another latch signal corresponding to a delayed signal delayed by one unitary delay time D from the delayed signal corresponding to the latch signal concerned of the logic level "0" has the logic level "0". In the shown case, the latch signal fulfilling such a relation is the data latch signal 44E. Namely, the data latch signal 44E has the logic level of "0", and the latch signal 44D positioned at one unitary delay time D before the latch signal 44E has the logic level "1" and the data latch signal 44F positioned at one unitary delay time D after the latch signal 44E has the logic level "0". In addition, as seen from FIGS. 4A and 4B, there can be found only one latch signal fulfilling the above mentioned relation. Thus, the priority decoder 46 activates one output line 46E corresponding to the delayed signal 40E, and accordingly, the selector 48 selects and outputs the delayed signal 40E as an output signal 50.

The signal 50 thus outputted has a rising edge delayed by a time $T_d$ from the rising edge of the trigger signal 34. The delay time $T_d$ can be expressed as follows:

$$T_d = T_1 + T_2 + T_3$$

where $T_1$ is the pulse width of the trigger signal 34;

$T_2$ is the delayed time from the falling edge of the trigger signal 34 to the rising edge of the selected delayed signal 40E; and $T_3$ is the delayed time from the moment the selected delayed signal 40E is inputted to the selector 48 to the moment the selected delayed signal 40E is outputted from the selector 48.

In the above mentioned equation, the delayed time $T_3$ assumes a constant value fixed by the structure of the selector 48, and the pulse width $T_1$ of the trigger signal 34 is also a fixed value. Therefore, only a variable factor is the delayed time $T_2$, but this delayed time $T_2$ is not greater than D.

In general, if a positional deviation between different projected objects on the screen of the scan type display does not exceed 5 nsec, the deviation cannot be recognized by the naked eye of a human being. Therefore, if the phase difference D of not greater than 5 nsec can be realized in the character generator, the above mentioned deviation between the different objects will not be recognized by the naked eye of a human being.

In the above mentioned embodiment, in order to detect the latched data signal 44E, the priority decoder operates to detect the latched data signal 44D and 44F which respectively have a minimum phase deviation in advance or in delay from the latched data signal 44E. But, if the priority decoder 46 is modified to detect each two or more latched data signals before and after the latched data signal to be detected.

As seen from the above description, the synchronization signal generator in accordance with the present invention is adapted to generate, on the basis of an original oscillation signal from an ceaselessly operated oscillator, a plurality of delayed signals having different delay times from the original oscillation signal, and then to select, among the delayed signals, only the delayed signal in synchronism with the trigger signal with a substantially constant but negligible delay. With this arrangement, the following advantages can be obtained:

(1) Since it is not necessary to start and stop an oscillator for the synchronization signal generator in synchronism with an external synchronization signal, it is possible to decrease the noise generated by the generator.

(2) In the case that a character generator integrated circuit is combined with another circuit having an oscillator to assemble a new integrated circuit, the character generator in accordance with the present invention can utilize the oscillator provided in the another circuit, and therefore, it is not necessary to provide an independent oscillator for the character generator.

(3) It is possible to sufficiently decrease the delay time from the triggering by the trigger signal to the rising edge of the selected delayed signal, by increasing the number of the delayed signals, with the result that it is possible to almost neglect the positional deviation of the superimposed picture. This effect can be realized even if the data latch circuit, the priority decoder and the selector have a low operation speed, respectively. In other words, the data latch circuit, the priority decoder and the selector are not required to have a high operation speed. This is very convenient to assemble the circuit in an integrated circuit.

The invention has thus been shown and described with reference to the specific embodiments. However, it should be noted that the present invention is in no way limited to the details of the illustrated structures but changes and modifications may be made within the scope of the appended claims.

We claim:

1. A synchronization signal generator for use in a scan type display device capable of superimposing a different picture upon a picture displayed in a display screen, comprising:

a trigger circuit responding to a synchronization signal to generate a trigger signal, a generator circuit responding to an original oscillation signal to generate a plurality of delayed signals having delay times which are different from one another and which are shorter than one period of the original oscillation signal, a latch circuit receiving the delayed signals and the trigger signal for latching respective logic levels of the delayed signals when the latch circuit is triggered by the trigger signal, a priority decoder coupled to the latch circuit for detecting, on the basis of the logic levels latched in the latch circuit, a delayed signal outputted from the delayed signal generator at a predetermined place of order counted from when the latch circuit is triggered by the trigger signal, and a selector circuit receiving the delayed signals and coupled to the decoder for selecting and outputting, among the plurality of delayed signals, the delayed signal detected by the priority decoder; wherein said latch circuit is composed of a plurality of unit circuits each of which includes a buffer receiving the corresponding delayed signal outputted from the delayed signal generator, a writing gate connected at its gate to receive the trigger signal from the trigger signal generator and connected at one end thereof to an output of the buffer, and a flipflop having an input connected to the other end of the writing gate and controlled by the trigger signal from the trigger signal generator so as to hold data given on the input of the flipflop; and wherein the flipflop is composed of an inverter having an input connected to the other end of the writing gate and a tristate inverter connected to the inverter in a reversed relation and having an inverted control input connected to receive the trigger signal from the trigger signal generator, whereby when the trigger signal is active, the tristate inverter is brought into an inoperable condition, so that the writing gate is opened and the input and output of the inverter are isolated from each other to allow the data inputted through the buffer to be inputted to the inverter and the output of the inverter to vary upon the data inputted through the buffer, and when the trigger signal is brought into an inactive condition, the writing gate is closed and the tristate inverter is brought into an operable condition, so that the input and output of the inverter are coupled through the tristate inverter to allow the input and output of the inverter to be locked through the operating tristate inverter.

2. A generator claimed in claim 1 wherein the delayed signal generator includes a plurality of cascade-coupled unitary delay circuits each of which gives a unitary delay time D which is obtained by dividing a period of the original oscillation signal by the number of the unitary delay circuits, the respective outputs of the unitary delay circuits being respectively outputted through a corresponding number of buffers as the delayed signals.

3. A generator claimed in claim 1 wherein the trigger signal generator includes a delay circuit having an input connected to receive the synchronization signal, an inverter having an input connected to an output of the delay circuit, a NAND circuit having a first input connected to directly receive the synchronization signal and a second input connected to an output of the inverter, and a second inverter receiving an output of the NAND circuit so as to output the above mentioned trigger signal.

4. A synchronization signal generator for use in a scan type display device capable of superimposing a different picture upon a picture displayed in a display screen, comprising:
a trigger circuit responding to a synchronization signal to generate a trigger signal,
a generator circuit responding to an original oscillation signal to generate a plurality of delayed signals having delay times which are different from one another and which are shorter than one period of the original oscillation signal,
a latch circuit receiving the delayed signals and the trigger signal for latching respective logic levels of the delayed signals when the latch circuit is triggered by the trigger signal,
a priority decoder coupled to the latch circuit for detecting, on the basis of the logic levels latched in the latch circuit, a delayed signal outputted from the delayed signal generator at a predetermined place of order counted from when the latch circuit is triggered by the trigger signal, and
a selector circuit receiving the delayed signals and coupled to the decoder for selecting and outputting, among the plurality of delayed signals, the delayed signal detected by the priority decoder; wherein
said selector circuit includes a plurality of buffers respectively receiving the delayed signals, a corresponding number of first NAND circuits arranged in parallel, each having a first input connected to receive an output of the corresponding buffer and a second input connected to receive a corresponding decoded signal from the priority decoder, a first logic circuit array composed of a plurality of second NAND circuits arranged in parallel, each of the second NAND circuits having a pair of inputs connected to receive outputs of a corresponding pair of first NAND circuits, a second logic circuit array composed of a plurality of first NOR circuits arranged in parallel, each of the first NOR circuits having a pair of inputs connected to receive outputs of corresponding pair of second NAND circuits, a third logic circuit array composed of a plurality of third NAND circuits arranged in parallel, each of the third NAND circuits having a pair of inputs connected to receive outputs of a corresponding pair of first NOR circuits, and a fourth logic circuit array composed of a second NOR circuit having a pair of inputs connected to receive respective outputs of the third NAND circuits.

5. A generator claimed in claim 4, wherein the delayed signal generator includes a plurality of cascade-coupled unitary delay circuits each of which gives a unitary delay time D which is obtained by dividing a period of the original oscillation signal by the number of the unitary delay circuits, the respective outputs of the unitary delay circuits being respectively outputted through a corresponding number of buffers as the delayed signals.

6. A generator claimed in claim 4, wherein the flipflop is composed of an inverter having an input connected to the other end of the writing gate and a tristate inverter connected to the inverter in a reversed relation and having an inverted control input connected to receive the trigger signal from the trigger signal generator, whereby when the trigger signal is active, the tristate inverter is brought into an inoperable condition, so that the writing gate is opened and the input and output of the inverter are isolated from each other to allow the data inputted through the buffer to be inputted to the inverter and the output of the inverter to vary upon the data inputted through the buffer, and when the trigger signal is brought into an inactive condition, the writing gate is closed and the tristate inverter is brought into an operable condition, so that the input and output of the inverter are coupled through the tristate inverter to allow the input and output of the inverter to be locked through the operating tristate inverter.

7. A generator claimed in claim 4, wherein the trigger signal generator includes a delay circuit having an input connected to receive the synchronization signal, an inverter having an input connected to an output of the delay circuit, a NAND circuit having a first input connected to directly receive the synchronization signal and a second input connected to an output of the inverter, and a second inverter receiving an output of the NAND circuit so as to output the above mentioned trigger signal.

8. A generator claimed in claim 4 wherein the latch circuit is composed of a plurality of unit circuits each of which includes a buffer receiving the corresponding delayed signal outputted from the delayed signal generator, a writing gate connected at its gate to receive the trigger signal from the trigger signal generator and connected at one end thereof to an output of the buffer, and a flipflop having an input connected to the other end of the writing gate and controlled by the trigger signal from the trigger signal generator so as to hold data given on the input of the flipflop.

* * * * *